(12) United States Patent
Suto et al.

(10) Patent No.: US 6,714,073 B2
(45) Date of Patent: Mar. 30, 2004

(54) PREDISTORTION TYPE DISTORTION COMPENSATION AMPLIFICATION APPARATUS

(75) Inventors: Masaki Suto, Tokyo (JP); Yoichi Okubo, Tokyo (JP); Toshio Takada, Tokyo (JP); Naoki Hongo, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/303,800

(22) Filed: Nov. 26, 2002

(65) Prior Publication Data

US 2003/0174019 A1 Sep. 18, 2003

(30) Foreign Application Priority Data

Mar. 15, 2002 (JP) ........................................ 2002-072055

(51) Int. Cl.[7] .................................................. H03F 1/26
(52) U.S. Cl. ......................... 330/149; 330/136; 375/297
(58) Field of Search ................................. 330/149, 151, 330/136, 129; 375/297; 455/63

(56) References Cited

U.S. PATENT DOCUMENTS

| | | | | |
|---|---|---|---|---|
| 6,388,518 B1 | * | 5/2002 | Miyatani | ..................... 330/149 |
| 6,498,529 B1 | * | 12/2002 | Kim et al. | ..................... 330/2 |
| 6,600,369 B2 | * | 7/2003 | Mitzlaff | ..................... 330/149 |

* cited by examiner

*Primary Examiner*—Henry Choe
(74) *Attorney, Agent, or Firm*—Bacon & Thomas, PLLC

(57) ABSTRACT

A distortion compensation amplification apparatus for compensating distortion generated while amplifying a signal, includes a distributor for distributing an input signal to provide a first and a second outputs, a first delay means for delaying the first output through the use of a surface acoustic wave element, a compensation value generation circuit, responsive to the second output, for determining amplitude and phase compensation values to be used in compensating the distortion, a second delay means for delaying the compensation values according to a delay time of the first delay means, and a predistortion circuit for compensating the output of the first delay means in response to the delayed compensation values. And the second delay means includes at least one type of circuit among the type of an analog delay circuit and a digital delay circuit.

2 Claims, 7 Drawing Sheets

PREDISTORTION TYPE DISTORTION COMPENSATION AMPLIFICATION APPARATUS

FIELD OF THE INVENTION

The present invention relates to a distortion compensation amplification apparatus of a predistortion type.

BACKGROUND OF THE INVENTION

A communications apparatus using W(Wideband)-CDMA(Code Division Multiple Access) signal and multi-carrier signal has a problem of distortion generation occurring when amplifing a signal. In order to solve the problem, a distortion compensation amplification apparatus is generally employed.

Referring to FIG. 5, there is illustrated a conventional feed forward type distortion compensation amplification apparatus. As shown in FIG. 5, the amplification apparatus includes a distributor 51, a primary amplifier 52, a delay line 53, a subtractor 54, a distortion amplifier 55, a delay line 56, and a subtractor 57. The distributor 51 and the subtractors 54 and 57 can be implemented by, e.g., a directional coupler.

First, an input signal is distributed by the distributor 51. One output of the distributor 51 is amplified by the primary amplifier 52 and then provided to the subtractor 54. The output of the primary amplifier 52 includes a distortion component that is generated at the time the primary amplifier 52 amplifies the input signal. The other output of the distributor 51 is fed to the subtractor 54 via the delay line 53. The subtractor 54 obtains the distortion component by subtracting the output of the delay line 53 from the output of the primary amplifier 52. The obtained distortion component is then fed to the distortion amplifier 55; and simultaneously, the output of the primary amplifier 52 is provided to the delay line 56 as an amplified signal. The distortion component is amplified by the distortion amplifier 55 and then fed to the subtractor 57. The amplified signal is delayed by the delay line 56, and subsequently fed to the subtractor 57. The subractor 57 removes the distortion component of the amplified signal by subtracting the output of the distortion amplifier 55 from the output of the delay line 56, after which the output of the subtractor 57 is provided to, e.g., a transmitter (not shown) for the transmission thereof.

The drawback of the above-mentioned distortion compensation amplification apparatus employing the feed forward method is a loss in the amplified signal outputted from the primary amplifier 52. Such loss occurs when the amplified signal passes through the subtractor 54, the delay line 56, and the subtractor 57. Thus generated loss necessitates the output level of the primary amplifier 52 to be controlled in order to meet the output higher than actually required by the amplification apparatus, resulting in the low efficiency of the primary amplifier 52.

The above-mentioned problem of the feed forward type distortion compensation amplification apparatus can be solved by using a predistortion type distortion compensation amplification apparatus. The conventional amplification apparatus for compensating distortion using the predistortion method is explained briefly with reference to FIG. 6 hereinbelow. As shown in FIG. 6, the amplification apparatus for compensating distortion includes a predistortion(PD) circuit 61 and a primary amplifier 62.

At the PD circuit 61, a predistortion component is added to an input signal to be provided to the primary amplifier 62. The amplitude of the predistortion component is the same as that of a distortion component to be generated by the primary amplifier 62 but the phases thereof are different by 180°. Thus, the distortion generated at the primary amplifier 62 is cancelled out by the predistortion. Consequently, an amplified signal with no distortion is generated as an output of the primary amplifier 62. As described, since the distortion-removed amplified signal is obtained without employing any additional circuits at the output side of the primary amplifier 62, the loss in the amplified signal can be prevented and thus the amplification efficiency can be improved.

In the predistortion type amplification apparatus, however, the predistortion provided by the PD circuit 61 should be adaptively adjusted to the distortion (generated by the primary amplifier 62) varying according to the frequency characteristic thereof and the variation of the input signal.

Distortion in an output of an amplifier will now be explained. The distortion in an output of an amplifier is originated from a gain characteristic and a phase characteristic of output of the amplifier. FIG. 7A depicts a plot of the gain characteristic versus an input level of a conventional amplifier. Herein, the x-axis represents the input level of the amplifier and the y-axis represents the gain of the amplifier. In FIG. 7A, G1 represents an ideal gain characteristic of amplifier and G2 represents an actual gain characteristic of the amplifier. That is, a predistortion circuit should be adjusted such that a combined result of the gain characteristic of the predistortion circuit and the gain characteristic G2 of the amplifier yields the ideal characteristic G1.

FIG. 7B depicts a plot of a phase characteristic versus an input level of the conventional amplifier. Herein, the x-axis represents the input level and the y-axis represents the phase of an output of the amplifier. In FIG. 7B, P1 represents the ideal phase characteristic of an ideal amplifier and P2 represents the actual phase characteristic of the amplifier. That is, the predistortion circuit should be adjusted such that a combining result of the phase characteristic of the predistortion circuit and the phase characteristic P2 of the amplifier yield the ideal characteristic P1.

The nature of the gain characteristic and the phase characteristic shown in FIG. 7A and FIG. 7B is very complex. Therefore, the characteristic of a predistortion circuit which gives rise to the ideal characteristic of an amplifier to realize a distortion compensation amplification apparatus outputting distortion-free amplified signals, can only be represented by a very complex function. Thus, it is virtually impossible to realize the ideal predistortion circuit by determining the coefficients of a characteristic curve by calculation in an analog manner.

FIG. 8 illustrates a block diagram of an exemplary predistortion type distortion compensation amplification apparatus. As shown in FIG. 8, the amplification apparatus includes a distributor 1, a delay circuit 2, a compensation circuit 200, a predistortion circuit 3, a primary amplifier 4, a distributor 5, a distortion detector circuit 10, and a table update circuit 12. Also, the compensation circuit 200 includes a power detector 6, an A/D converter 7, an amplitude compensation table 8a, a D/A converter 9a, an LPF (Low Pass Filter) 10a, a phase compensation table 8b, a D/A converter 9b and an LPF 10b. The predistortion circuit 3 includes an attenuator 31 and a phase shifter 32.

An input signal is distributed by a distributor 1. One output of the distributor 1 is fed to the delay line 2, and the other output of the distributor 1 is provided to the compensation circuit 200.

In the compensation circuit 200, the power detector 6 detects instantaneous amplitude levels by executing an envelope detection of the output of the distributor 1. The detected instantaneous amplitude levels are converted from an analog signal form into a digital signal form by the A/D converter 7, and then are fed to the an amplitude compensation table 8a and the phase compensation table 8b.

The amplitude compensation table 8a stores in a memory amplitude compensation data for each of various amplitude levels, the amplitude compensation data being used in compensating an amplitude of an input signal having a corresponding amplitude level. The amplitude compensation data corresponding to detected instantaneous amplitude level is read off the memory and sent to the D/A converter 9a. The amplitude compensation data is converted from a digital signal to an analog signal by the D/A converter 9a, which is then fed to the LPF 10a where high frequency components of the signal is removed. The output of the LPF 10a is fed to the attenuator 31 in the predistortion circuit 3.

In a similar fashion, the phase compensation table 8b stores in a memory phase compensation data for each of various amplitude levels, the phase compensation data being used in compensating an phase of an input signal having a corresponding amplitude level. The phase compensation data corresponding to the detected instantaneous amplitude level is read off the memory and is sent to the D/A converter 9b. The phase compensation data is converted from a digital signal into an analog signal by the D/A converter 9b, which is then fed to the LPF 10b where high frequency components of the signal is removed. The output of the LPF 10b is dispatched to the phase shifter 32 in the predistortion circuit 3.

The delay circuit 2 delays its input from the distributor 1 in such a way that the delay time thereof equals to that of the outputs of the compensation circuit 200. The delayed output of the delay circuit 2 is fed to the predistortion circuit 3. Accordingly, the outputs of the compensation circuit 200 which are the amplitude compensation data and the phase compensation data, and that of the delay circuit 2 are synchronously fed to the predistortion circuit 3.

In the predistortion circuit 3, the attenuator 31 amplitude distortion corresponding to the amplitude compensation data to the output of the delay circuit 2, and the output of the attenuator 31 is fed to the phase shifter 32. The phase shifter 32 adds phase distortion corresponding to the phase compensation data to the output of the attenuator 31, and the output of the phase shifter 32 is fed to the primary amplifier 4. Because the output of the phase shifter 32 is fed to the primary amplifier 4, an amplitude distortion and a phase distortion, which are generated by the primary amplifier 4, are compensated by the amplitude distortion and the phase distortion, which are generated by the predistortion circuit 3. Therefore, the output of the primary amplifier 4 with no distortion is provided outside the amplification apparatus via the distributor 5.

By storing the amplitude and phase compensation data in the amplitude and the phase compensation table 8a and 8b, the amplitude distortion and phase distortion can be adaptively applied by the predistortion circuit 3 to the varying distortions generated by the primary amplifier 4 according to the gain and phase characteristics as a function of the input level, as shown in FIGS. 7A and 7B. Accordingly, the ideal characteristics can be acquired, so that a distortion compensation amplification apparatus capable of outputting distortion-free amplified signals can be realized.

A part of the amplified signal distributed by the distributor 5 is fed to the distortion detection circuit 11. The distortion detection circuit 11 detects a residual distortion component which might persist in the part of the amplified signal after distortion compensation has taken place, and outputs same to the table update circuit 12. The table update circuit 12 determines amplitude compensation data and phase compensation data that can minimize the residual distortion component, and transfers same to the amplitude compensation table 8a and the phase compensation table 8b, thereby enabling optimum amplitude and phase compensation data to be rewritten in the amplitude compensation table 8a and the phase compensation table 8b. By renewing the amplitude compensation data and the phase compensation data using above-mentioned feedback scheme, an effectively operable distortion compensation amplification apparatus can be realized, independent of, for example, a temperature variation and an aged deterioration.

A problem herein is a considerable size of the delay circuit. As mentioned above, in order to synchronize the delay circuit and the compensation circuit, the delay time of the delay circuit and that of the compensation circuit need to be the same. In general, the delay time is approximately 100 nsec. In order to implement such a large delay by using a cable, the required length thereof amounts to approximately 20 m. Consequently, distortion compensation amplification apparatus becomes bulky and heavy. Furthermore, when using a general-purpose small sized delay block to acquire a delay time of approximately 100 nsec, a power loss in the delay block becomes 50 dB to 100 dB. Addressing the power loss problem by augmenting the number of amplifier stages also, creates problems of considerable power consumption and size of an apparatus.

SUMMARY OF THE INVENTION

It is, therefore, an object of the present invention to provide a predistortion type employing therein a compact and cost-effective delay circuit.

In accordance with the present invention, there is provided a distortion compensation amplification apparatus for compensating distortion generated while amplifying a signal, including: a distributor for distributing an input signal to provide a first and a second outputs; a first delay means for delaying the first output through the use of a surface acoustic wave element; a compensation value generation circuit, responsive to the second output, for determining amplitude and phase compensation values to be used in compensating the distortion; a second delay means for delaying the compensation values according to a delay time of the first delay means; and a predistortion circuit for compensating the output of the first delay means in response to the delayed compensation values.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
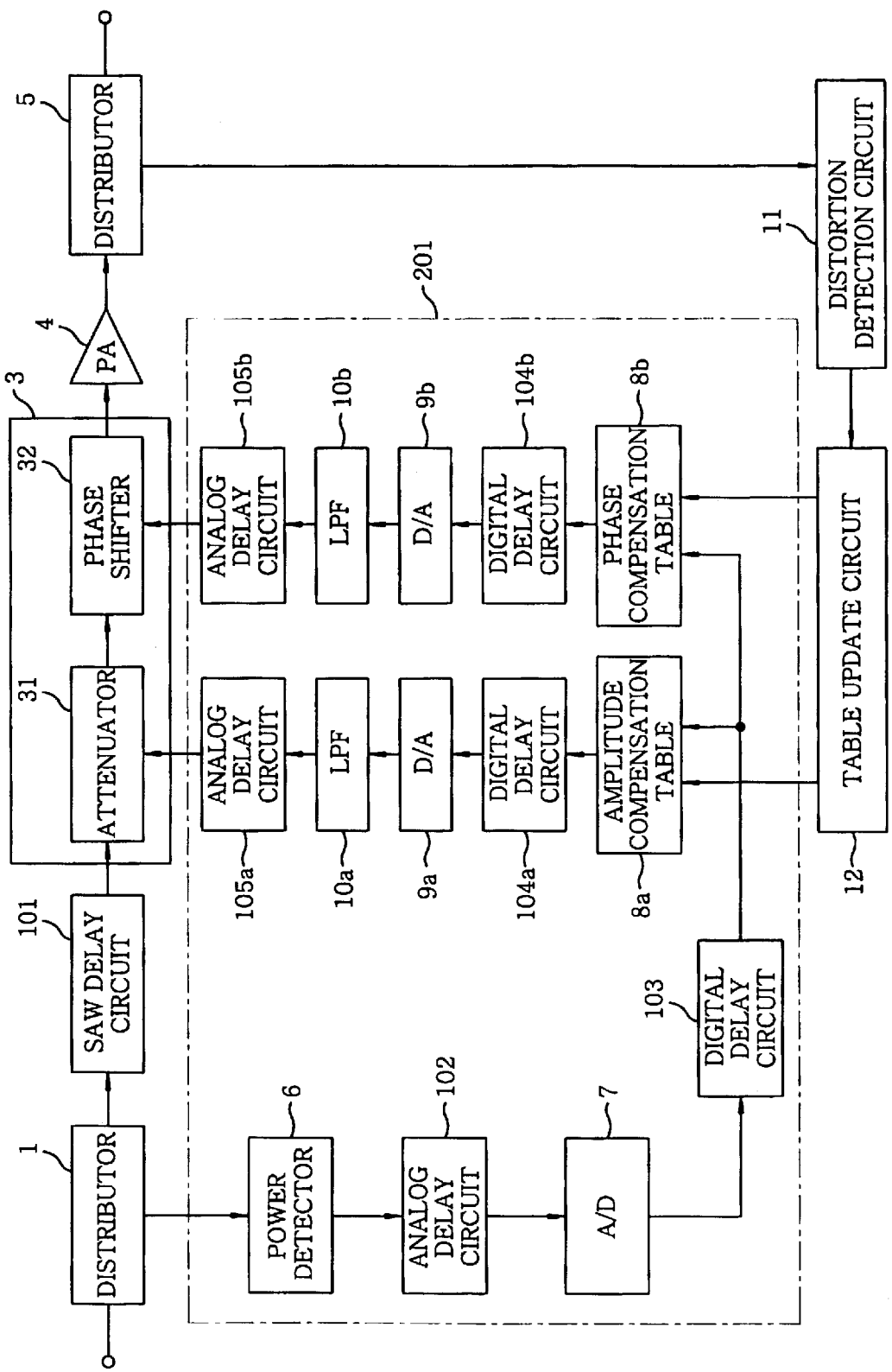
FIG. 1 shows a block diagram of a distortion compensation amplification apparatus in accordance with a first preferred embodiment of the present invention.
Figure 8:
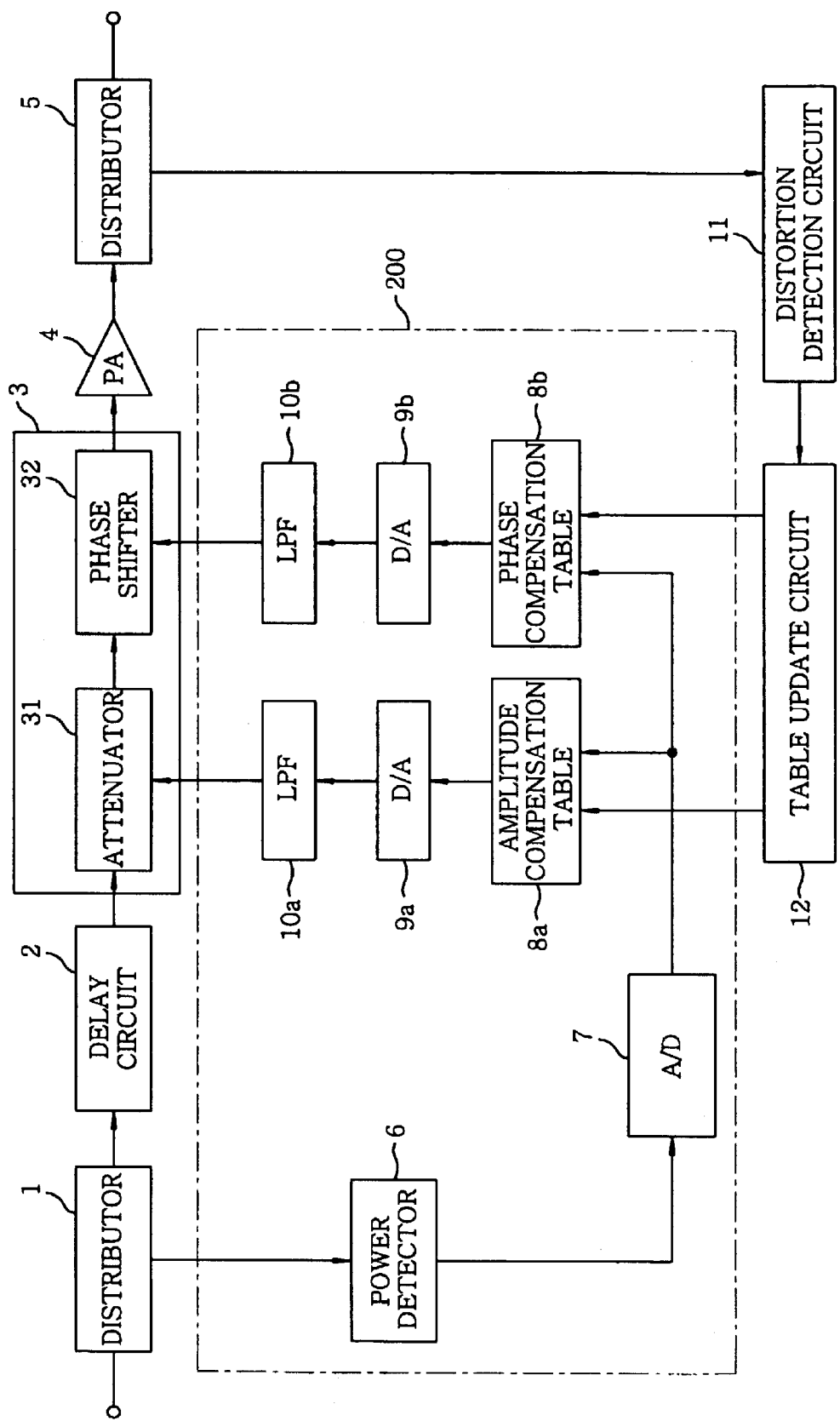
FIG. 8 represents a detailed block diagram of a conventional predistortion type distortion compensation amplification apparatus.

FIG. 1 is a block diagram of a distortion compensation amplification apparatus in accordance with a first preferred embodiment of the invention. Like reference numerals commonly used in FIGS. 1 and 8 represent like or equivalent parts and, therefore, will not be described repeatedly. A delay means in the present invention is embodied by a SAW (Surface Acoustic Wave) delay circuit 101, which includes SAW element that can provide a larger delay but with a smaller loss than the conventional delay circuit 2. The loss of the SAW delay circuit 101 is limited to about 20 dB, which is equivalent to the loss incurred from a delay circuit made of 20~30 m cable. The SAW delay circuit 101 has a size of about 5mm×7 mm. The SAW delay circuit 101 is a first delay means in this preferred embodiment.

Moreover, instead of the compensation circuit 200, a compensation circuit 201 is used. The compensation circuit 201 includes an analog delay circuit 102 between a power detector 6 and an A/D converter 7, which are the same parts as those of the compensation circuit 200; a digital delay circuit 103 between the A/D converter 7 and an amplitude and a phase compensation table 8a and 8b; a digital delay circuit 104a between the amplitude compensation table 8a and a D/A converter 9a; a digital delay circuit 104b between the phase compensation table 8b and a D/A converter 9b; an analog delay circuit 105a between an LPF 10a and an attenuator 31; and an analog delay circuit 105b between an LPF 10b and a phase shifter 32. The compensation circuit 201 corresponds to a compensation value determining means in the preferred embodiment of the present invention.

The features of the present invention, i.e., the SAW delay circuit 101 and other delay circuits, i.e., the analog delay circuits 102, 105a, 105b, and the digital delay circuits 103, 104a, 104b, which are provided in the compensation circuit 201 so as to compensate for the delay of the SAW delay circuit 101, will now be explained in detail.

The SAW delay circuit 101 in the present invention is implemented as a delay circuit having a delay time of at least 300 nsec, more specifically about 500 nsec, whereas the delay time required in the delay circuit 2 of the conventional distortion compensation amplification apparatus is generally 100 nsec. Therefore, the delay time of the compensation circuit 201 needs to be increased, so that the compensation circuit 201 incorporates the analog delay circuits 102, 105a, 105b and the digital delay circuits 103, 104a, 104b.

The analog delay circuits 102, 105a, 105b process baseband signals, so that each of the circuits 102, 105a, 105b can be implemented by, e.g., a simple LPF, whereas the digital delay circuits 103, 104a, 104b process digital signals, so that each of the circuits 103, 104a, 104b can be implemented by, e.g., a simple flip/flop circuit. Furthermore, the analog delay circuits 105a, 105b are preferably placed between the D/A converter 9a and the attenuator 31, and between the D/A converter 9b and the phase shifter 32, respectively, but they are not necessarily located at the output sides of the LPFs 10a, 10b respectively. Furthermore, as long as the absolute average delay time of the compensation circuit 201 is same as that of the SAW delay circuit 101, one of more of the analog delay circuit 102, 105a, 105b, and the digital delay circuit 103, 104a, 104b can be omitted.

Figure 2:
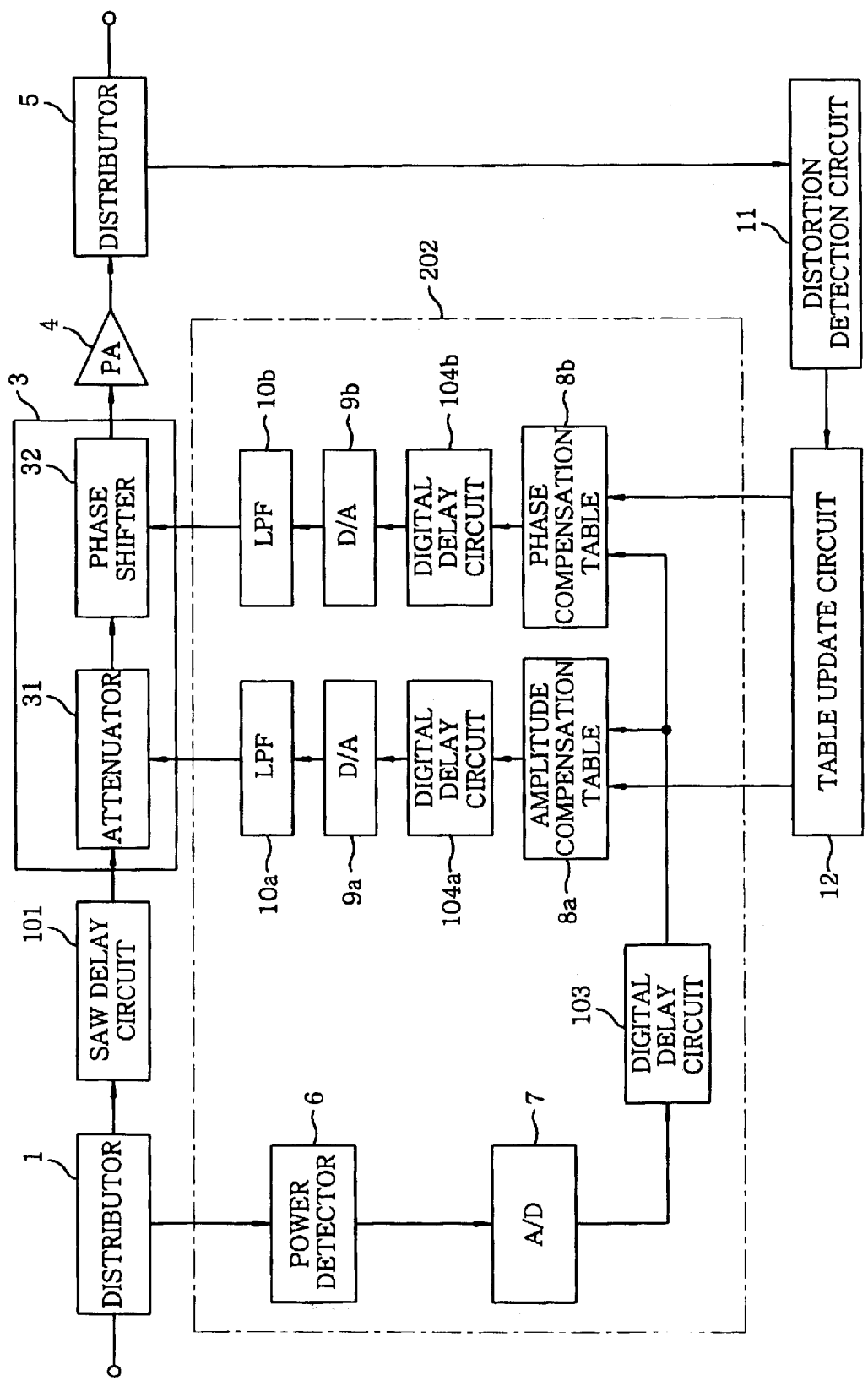
FIG. 2 describes a block diagram of a distortion compensation amplification apparatus in accordance with a second preferred embodiment of the present invention.

FIG. 2 is a block diagram of a distortion compensation amplification apparatus in accordance with a second preferred embodiment of the invention. Like reference numerals commonly used in FIGS. 1 and 2 represent like or equivalent parts and, therefore, description thereof will not be repeated. The second preferred embodiment of the present invention includes a compensation circuit 202 in lieu of the compensation circuit 201 in FIG. 1. The compensation circuit 202 is identical to the compensation circuit 201, excepting that the compensation circuit 202 is devoid of the analog delay circuits 102, 105a, 105b. The delay time of the compensation circuit 202, which is set by the digital delay circuit 103, 104a, 104b, corresponds to the delay time of the SAW delay circuit 101. Thus, the distortion compensation amplification apparatus of FIG. 2 essentially has the same functionality as that of FIG. 1.

Figure 3:
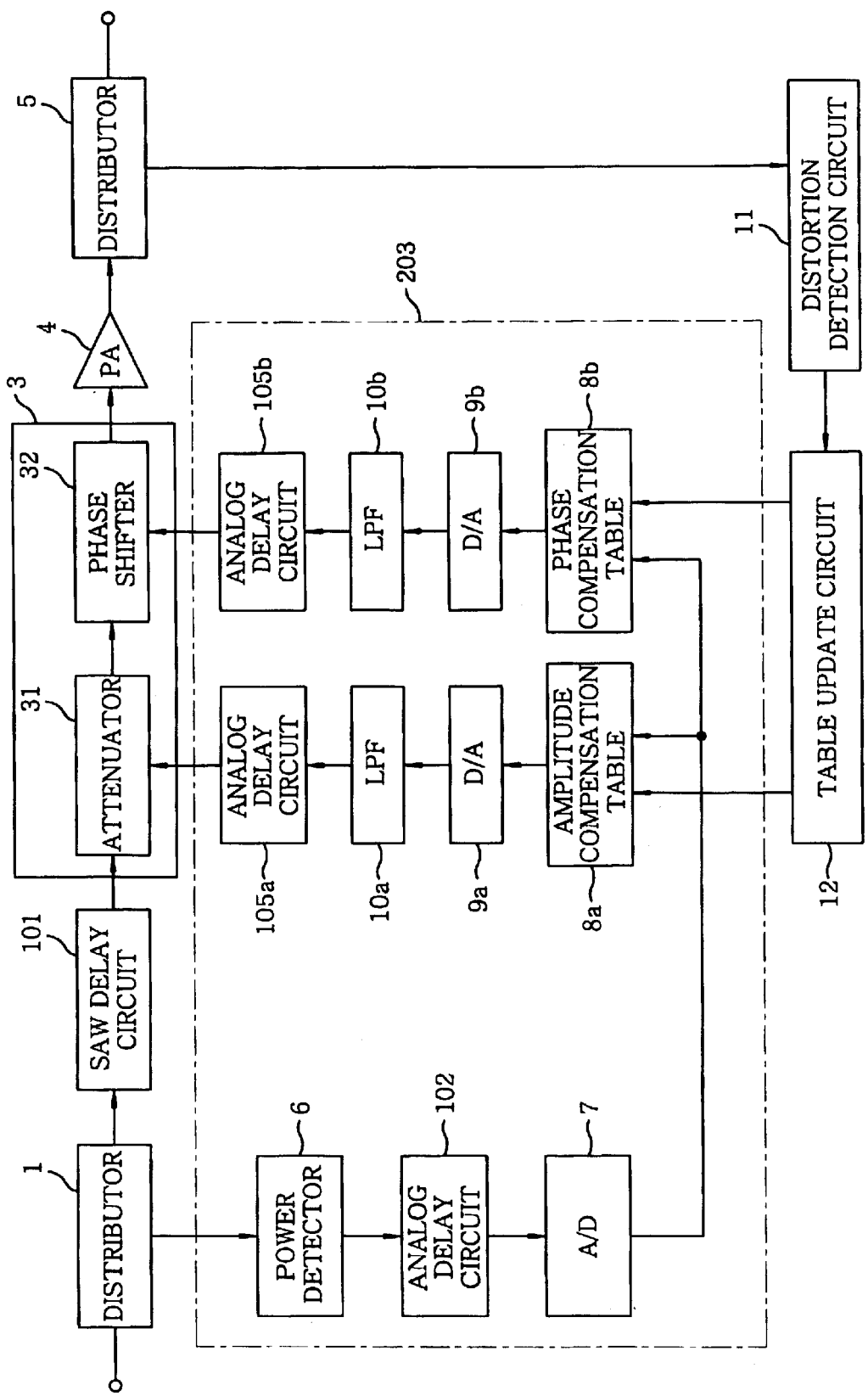
FIG. 3 illustrates a block diagram of a distortion compensation amplification apparatus in accordance with a third preferred embodiment of the present invention.

FIG. 3 is a block diagram of a distortion compensation amplification apparatus in accordance with a third preferred embodiment of the invention. Like reference numerals commonly used in FIGS. 1 and 3 represent like or equivalent parts and, therefore, description thereof will not be repeated. The third preferred embodiment of the present invention includes a compensation circuit 203 in lieu of the compensation circuit 201 in FIG. 1. The compensation circuit 203 is identical to the compensation circuit 201, excepting that the compensation circuit 203 is devoid of the digital delay circuits 103, 104a, 104b. The delay time of the compensation circuit 203, which is set by the analog delay circuit 102, 105a, 105b, corresponds to the delay time of the SAW delay circuit 101. Thus, the distortion compensation amplification apparatus of FIG. 3 essentially has the same functionality as that of FIG. 1.

Figure 4:
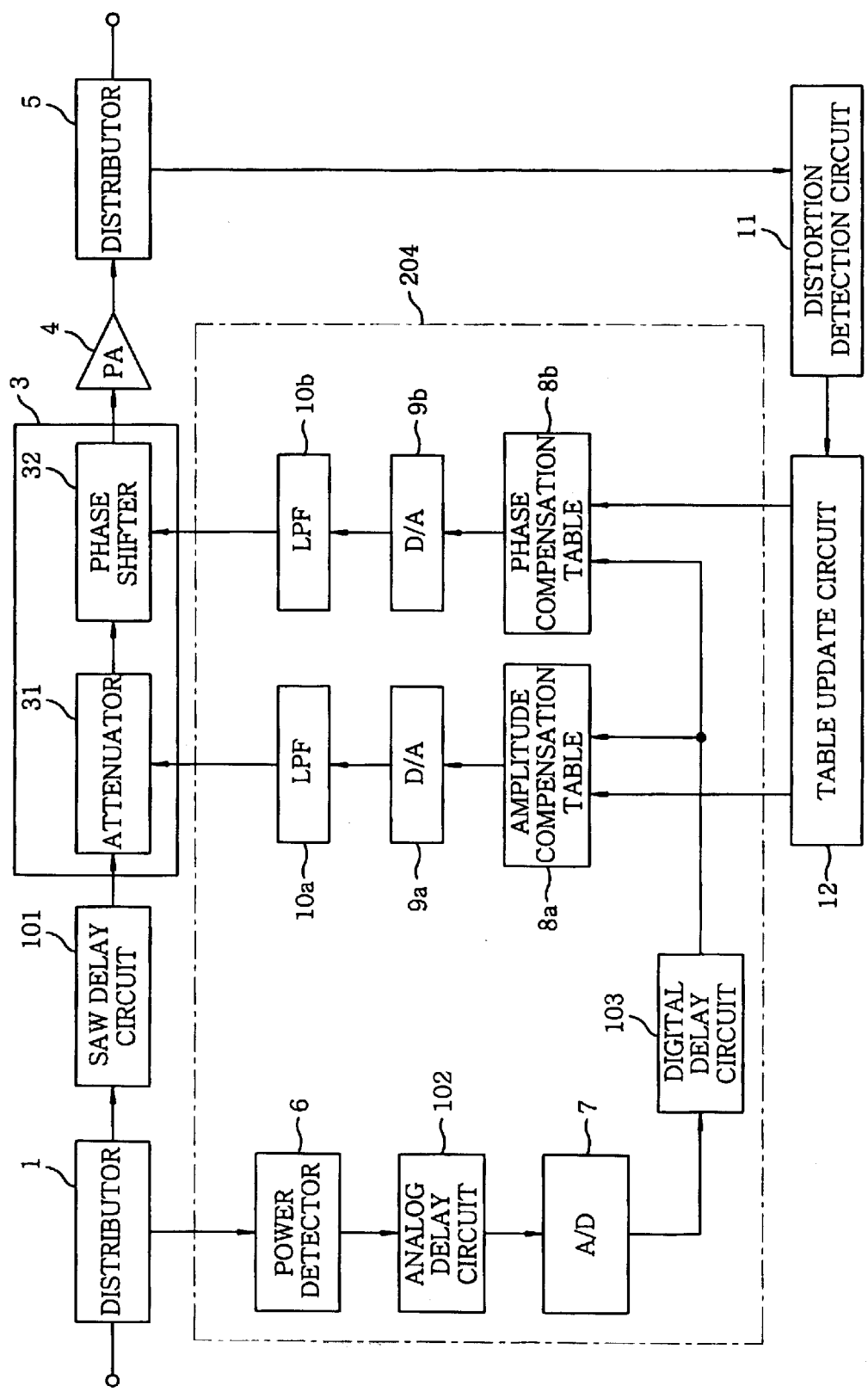
FIG. 4 offers a block diagram of a distortion compensation amplification apparatus in accordance with a fourth preferred embodiment of the present invention.
Figure 5:
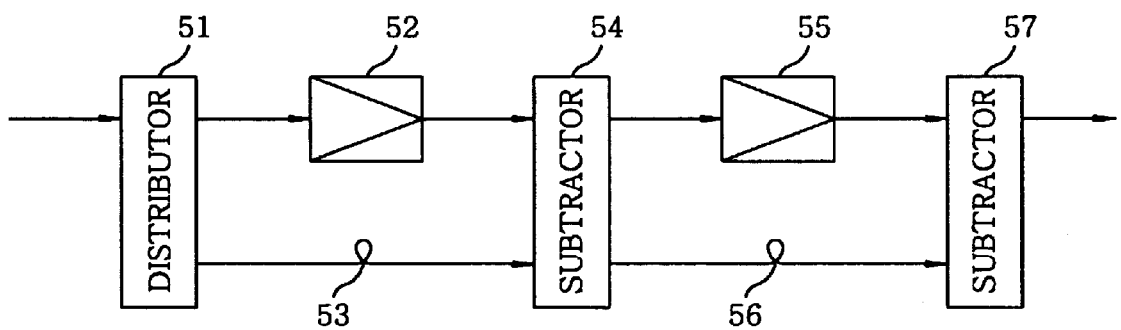
FIG. 5 provides a block diagram of a conventional feed forward type distortion compensation amplification apparatus.
Figure 6:
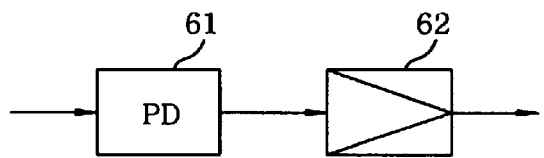
FIG. 6 presents a simplified block diagram of a conventional predistortion type distortion compensation amplification apparatus.
Figure 7A:
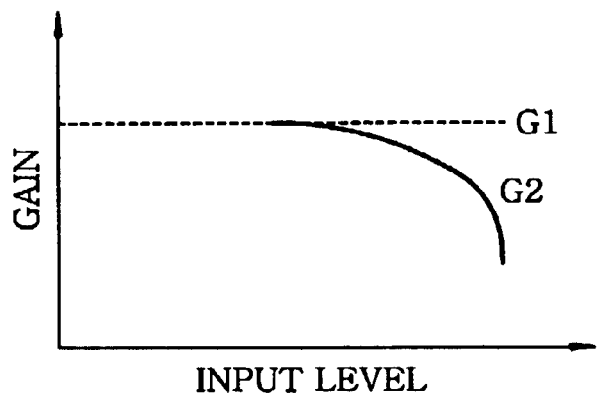
FIGS. 7A and 7B respectively depict a gain characteristic and a phase characteristic versus an input level of a conventional amplifier.
Figure 7B:
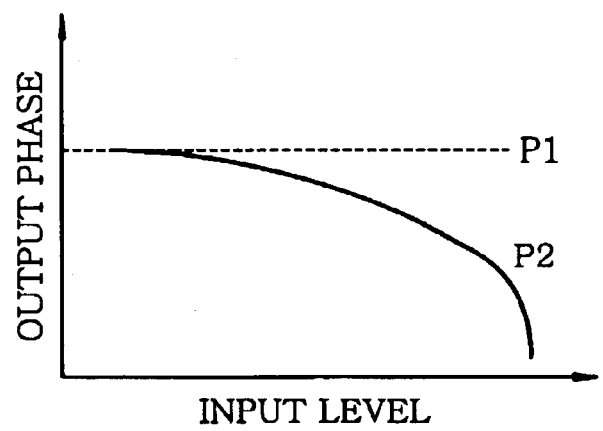

FIG. 4 is a block diagram of a distortion compensation amplification apparatus in accordance with a third preferred embodiment of the invention. Like reference numerals commonly used in FIGS. 1 and 4 represent like or equivalent parts and, therefore, description thereof will not be repeated. The fourth preferred embodiment of the present invention includes a compensation circuit 204 in lieu of the compensation circuit 201 in FIG. 1. The compensation circuit 204 is identical to the compensation circuit 201, excepting that the compensation circuit 204 is devoid of the analog delay circuits 105a, 105b and the digital delay circuits 104a, 104b. The delay time of the compensation circuit 204, which is set by the analog delay circuit 102 and the digital delay circuit 103 corresponds to the delay time of the SAW delay circuit 101. Thus, the distortion compensation amplification apparatus of FIG. 4 essentially has the same functionality as that of FIG. 1.

While the invention has been shown and described with respect to the preferred embodiments, it will be understood by those skilled in the art that various changes and modifications may be made without departing from the spirit and the scope of the invention as defined in the following claims.

What is claimed is:

1. A distortion compensation amplification apparatus for compensating distortion generated while amplifying a signal, comprising:

a distributor for distributing an input signal to provide a first and a second outputs;

a first delay means for delaying the first output through the use of a surface acoustic wave element;

a compensation value generation circuit, responsive to the second output, for determining amplitude and phase compensation values to be used in compensating the distortion;

a second delay means for delaying the compensation values according to a delay time of the first delay means; and a predistortion circuit for compensating the output of the first delay means in response to the delayed compensation values.

2. The apparatus of claim 1, wherein the second delay means includes at least one analog or digital delay circuit.

* * * * *